PRECISION OPTICAL SPACERS FOR IMAGE SENSOR FILTERS

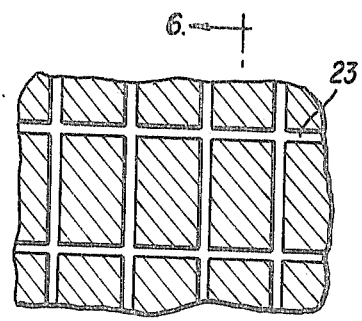
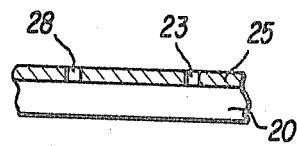
FIG.5  FIG.6
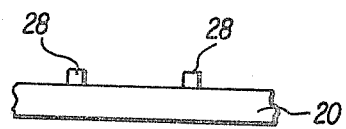
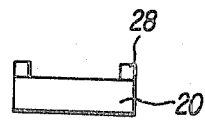
FIG.7  FIG.8
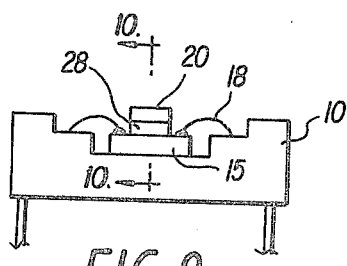
FIG.9  FIG.10

BACKGROUND OF THE INVENTION

1. Field of the Invention

This invention relates to packages for integrated circuits, and in particular a process and the resulting structure for fabricating precision optical spacers of desired thickness to separate a window or filter from an image sensor such as a charged coupled device.

2. Brief Description of the Prior Art

Several techniques have been used to fabricate a precision optical spacer for separating an image sensing device from a filter or window. One prior art technique has been to utilize mechanical spacers, for example, precision machined material, to dispose between the image sensor and the overlying filter or window. Such techniques have typically been expensive, difficult to fabricate in applications where very thin spacers are required, and difficult to handle and align.

Another prior art technique has been to deposit metal or other material directly on the surface of the integrated circuit and attempt to form the material to the desired thickness. Such techniques require several extra masks during the fabrication of the image sensor or other integrated circuit, resulting in a lower overall yield. Additionally, such techniques make back lapping the substrate on which the integrated circuit or image sensor is formed difficult, and frequently result in cracking of the sensor during back lapping.

A third prior art approach has been to design precision packages for containing the image sensor. Such packages typically require extremely careful manufacturing processes, with accordingly high cost.

SUMMARY OF THE INVENTION

The process and resulting structure of this invention overcome the disadvantages of the prior art processes and structures. In particular, the process of this invention, by fabricating the spacing device directly on the window or filter, does not require precision manufactured mechanical spacers or precision packages. The difficulties of depositing metal or other material on the underlying image sensing device are also eliminated. In one embodiment a process for fabricating spacers of desired thickness for a filter to be used in separating the filter from an underlying integrated circuit structure comprises the steps of: forming a pattern of electrically conductive material on one surface of the filter, the electrically conductive material being substantially thinner than the desired thickness; depositing selected material over all of the filter except on the electrically conductive material, the selected material being deposited to substantially the desired thickness; depositing additional electrically conductive material on at least the pattern of electrically conductive material; and removing the selected material.

In another embodiment a package for an image sensing device comprises: a filter, an image sensing device including bonding pads; an electrically conductive pattern disposed on the filter and separating the filter from the image sensing device, the pattern disposed on the filter being nowhere in contact with the bonding pads.

DETAILED DESCRIPTION

Figure 1:
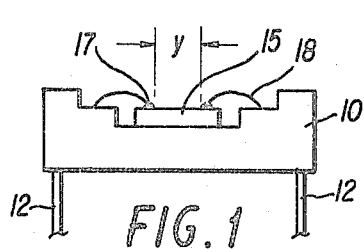
FIG. 1 is a cross-sectional view of an integrated circuit package showing an image sensor chip and associated bonding pads.

FIG. 1 is a cross-sectional view of a typical integrated circuit package showing the substrate 10, a portion of electrically connecting pins 12, integrated circuit 15, bonding pads 17 and bonding wires 18. It is an object of this invention to provide a process for fabricating a structure to enable attaching a window or filter to the upper surface of circuit 15 at a precise spacing above the upper surface of circuit 15. In the preferred embodiment circuit 15 will be an image sensing device, for example a charge coupled device.

Figure 2:
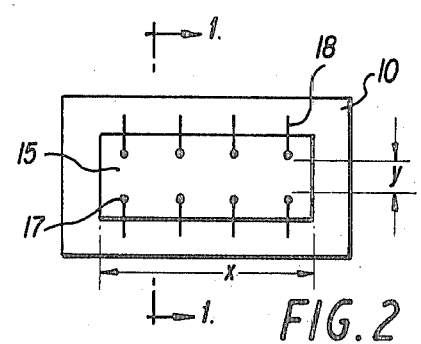
FIG. 2 is a top view of the structure shown in FIG. 1.

FIG. 2 is a top view of the structure shown in FIG. 1 with corresponding portions given corresponding designations. For purposes of explanation of the invention it is assumed that a window or filter having length X and width Y is desired to be disposed parallel to image sensor 15 and at a fixed spacing away from sensor 15. It is further assumed that the filter or window to be disposed above circuit 15 is not to contact the semiconductor surface. Contact with the semiconductor surface is particularly undesirable in conjunction with charge coupled devices which are known to be extremely surface sensitive.

Figure 3:
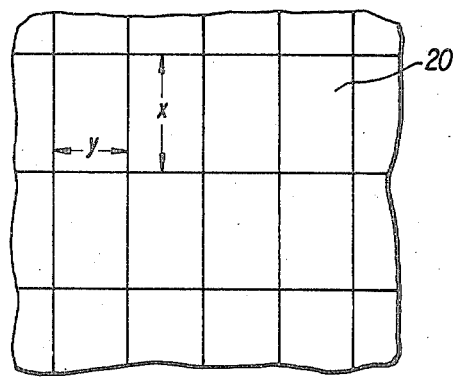
FIG. 3 depicts an array of filters, each one of which is to be disposed over a single imaging sensing device.

FIG. 3 shows an array of window or filter planforms chosen which have dimensions which fall within the bonding pad region of the circuit shown in FIG. 2. The array of windows or filters 20 will be an appropriate multiple of the X and Y dimensions such that a multiplicity of filters 20 may be processed simultaneously. The convenient multiple may be chosen depending upon the dimensions of the process equipment used. As used herein, the terms filter and window are intended to be interchangeable. The terms are intended to refer to any piece of material which is desired to be disposed a fixed distance from an underlying integrated circuit or image sensor.

Figure 4:
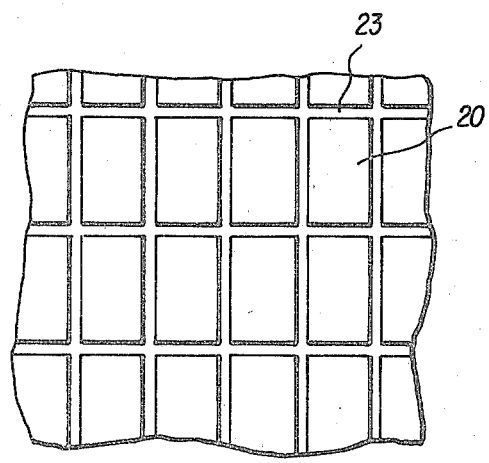
FIG. 4 depicts the array of FIG. 3 after an electrically conductive grid has been formed.

Next, as shown in FIG. 4 an adherent electrically conductive pattern 23 is formed on the surface of the array of filters 20. The adherent electrically conductive coating may be any desired coating. In the preferred embodiment layers or films of chromium with copper and chromium with gold have been found suitable. The metal is typically deposited to a thickness of approximately 5000 to 10,000 angstroms, for example using evaporation or sputtering techniques. The pattern may be defined using any suitable method, for example, well known photolithographic masking techniques in conjunction with photoresist and etching processed, or resist lifting techniques. It is essential, however, that the metal pattern 23 be fabricated using a platable metal.

After the metal grid 23 has been formed, a layer of dry film resist, for example, Riston manufactured by Dow Chemical Corporation, is deposited everywhere on each filter 20 except where the grid portion 23 is formed. The dry resist is deposited to whatever thickness is desired for the separation between filter 20 and intergrated circuit 15. In the preferred embodiment in conjunction with a charge coupled device, resist 25 will be approximately 0.5 to 1.0 mils thick.

Figure 5:
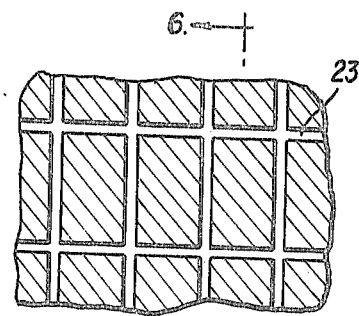
FIG. 5 depicts the array of FIG. 4 after deposition of a pattern of selected material and further deposition of electrically conductive material.
Figure 6:
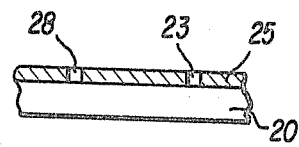
FIG. 6 is a cross-sectional view of the structure shown in FIG. 5.

As also shown in FIG. 6, the grid 23 is electroplated to thicken the electrically conductive pattern to the desired thickness of the resist 25. The relatively uniform field created by grid 23 helps ensure a uniform current density, and thereby ensure that additionally deposited conductive material 28 will be substantially as thick as resist 25. We have discovered that the resist 25 has a self-limiting effect on the thickness of plating 28. That is, plating 28 will virtually stop when it reaches a thickness corresponding to the thickness of resist 25.

Figure 7:
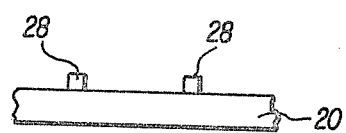
FIG. 7 is a subsequent cross-sectional view after removal of the selected material from the structure of FIG. 6.

As next shown in FIG. 7 resist 25 is removed from the surface of filter 20 to lead the electrically conductive regions 28. This step may be accomplished using an appropriate solvent for the resist chosen. For example the Riston resist may be removed using acetone.

Figure 8:
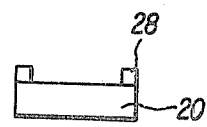
FIG. 8 is a subsequent cross-sectional view after division of the array of filters into individual filters.

As shown in FIG. 8 the array of filters 20 is then separated into individual filters using any well known technique. In the preferred embodiment the array of filters 20 is separated by scribing the filters and then breaking them apart. Depending upon the type of filter, however, sawing or laser cutting may also be used.

Figure 9:
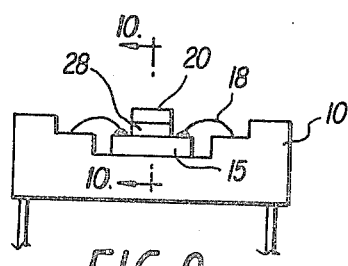
FIG. 9 is a cross-sectional view of an integrated circuit package showing how the filter of FIG. 8 may be mounted on the image sensor chip.

As shown in FIG. 9 filter 20 may be attached to the surface of sensor 15 using any desired technique, for example optical cement or epoxy. The effect of the electrically conductive material 28 is to space filter 20 away from chip 15 by the desired distance.

Figure 10:
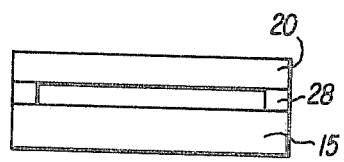
FIG. 10 is an expanded cross-sectional view of the structure shown in FIG. 9.

An expanded cross-sectional view of the structure shown in FIG. 9 appears at FIG. 10. This figure more clearly illustrates the spacing between filter 20 and sensor 15 caused by plated regions 28.

This invention provides a method and structure by which precision spacers, providing a fixed optical distance between a semiconductor image sensing device and a filter, may be economically produced. The procedure utilizes known semiconductor metallurgical processes and circumvents the disadvantages inherent in prior art techniques. The invention is readily adaptable to batch processing, allows great flexibility in the format of the spacer and minimum tooling costs. The invention is particularly suitable for separating a filter for a charged coupled device from the device itself.

What is claimed is:
1. A structure comprising
    an image sensing device containing bonding pads;
    a filter;
    an electrically conductive pattern on the filter separating the filter from the image sensing device, the pattern disposed on the filter not in contact with the bonding pads.
2. A structure as in claim 1 wherein the image sensing device is a charge coupled device.
3. A structure as in claim 2 wherein the filter is an optical filter.
4. A structure as in claim 1 wherein the electrically conductive pattern comprises chromium.

* * * * *